(12) United States Patent
Consoli et al.

(10) Patent No.: US 11,894,629 B2
(45) Date of Patent: Feb. 6, 2024

(54) ELECTRICAL INTERCONNECT WITH CONDUCTIVE POLYMER CONTACTS HAVING TIPS WITH DIFFERENT SHAPES AND SIZES

(71) Applicants: TE Connectivity Services GmbH, Schaffhausen (CH); TYCO ELECTRONICS JAPAN G.K., Kawasaki (JP)

(72) Inventors: John Joseph Consoli, Harrisburg, PA (US); Chad William Morgan, Carneys Point, NJ (US); Megan Hoarfrost Beers, Redwood City, CA (US); Christopher William Blackburn, Bothell, WA (US); Nathan Lincoln Tracy, Harrisburg, PA (US); Jennifer Love, Enola, PA (US); Clarence Leon Yu, Sacramento, CA (US); Shinichi Hashimoto, Kangawa (JP); Hiroshi Shirai, Kangawa (JP)

(73) Assignees: TYCO ELECTRONICS JAPAN G.K., Kawasaki (JP); TE CONNECTIVITY SOLUTIONS GmbH, Schaffhausen (CH)

( * ) Notice: Subject to any disclaimer, the term of this patent is extended or adjusted under 35 U.S.C. 154(b) by 52 days.

(21) Appl. No.: 17/195,738

(22) Filed: Mar. 9, 2021

(65) Prior Publication Data
US 2022/0294145 A1    Sep. 15, 2022

(51) Int. Cl.
*H01R 13/24*    (2006.01)
*H01R 12/71*    (2011.01)
(Continued)

(52) U.S. Cl.
CPC ........ *H01R 13/2407* (2013.01); *H01R 12/52* (2013.01); *H01R 12/714* (2013.01);
(Continued)

(58) Field of Classification Search
CPC .. H01R 13/2407; H01R 12/52; H01R 12/714; H01R 13/11; H01R 13/241;
(Continued)

(56) References Cited

U.S. PATENT DOCUMENTS

| 5,527,591 A | 6/1996 | Crotzer et al. |
| 5,599,193 A | 2/1997 | Crotzer |

(Continued)

FOREIGN PATENT DOCUMENTS

| CN | 1672221 A | * | 9/2005 | ............ C08L 83/04 |
| KR | 101393601 B1 | | 5/2014 | |

(Continued)

*Primary Examiner* — Abdullah A Riyami
*Assistant Examiner* — Justin M Kratt

(57) ABSTRACT

A socket assembly includes an electrical interconnect having an insulator having apertures. The electrical interconnect includes primary contacts and secondary contacts received in corresponding apertures. The primary contacts include a primary conductive polymer column having upper contact tips and lower contact tips for electrically interconnecting first and second electronic packages. The secondary contacts include a secondary conductive polymer column having upper contact tips and lower contact tips for electrically interconnecting the first and second electronic packages. The contact tips of the secondary conductive polymer columns have a different shape from the shape of the contact tips of the primary conductive polymer columns.

20 Claims, 5 Drawing Sheets

(51) Int. Cl.
*H01R 12/52* (2011.01)
*H01R 13/6599* (2011.01)
*H01R 13/11* (2006.01)
*H05K 1/09* (2006.01)

(52) U.S. Cl.
CPC .......... *H01R 13/11* (2013.01); *H01R 13/2414* (2013.01); *H01R 13/6599* (2013.01); *H05K 1/095* (2013.01); *H01R 12/712* (2013.01); *H05K 2201/03* (2013.01); *H05K 2201/0314* (2013.01); *H05K 2201/0329* (2013.01)

(58) Field of Classification Search
CPC .. H01R 13/6599; H01R 12/712; H05K 1/095; H05K 2201/03; H05K 2201/0314; H05K 2201/0329
See application file for complete search history.

(56) References Cited

U.S. PATENT DOCUMENTS

| | | | |
|---|---|---|---|
| 5,600,099 A | 2/1997 | Crotzer et al. | |
| 5,766,021 A | 6/1998 | Pickles et al. | |
| 5,871,842 A | 2/1999 | Crotzer et al. | |
| 5,949,029 A | 9/1999 | Crotzer et al. | |
| 6,345,989 B1 | 2/2002 | Mason et al. | |
| 6,796,810 B2 | 9/2004 | DelPrete et al. | |
| 7,391,227 B2 | 6/2008 | Inoue et al. | |
| 7,393,471 B2 | 7/2008 | Inoue et al. | |
| 7,448,883 B2 | 11/2008 | Alden, III et al. | |
| 7,549,870 B2 | 6/2009 | Mason et al. | |
| 7,585,173 B2 | 9/2009 | Hilty et al. | |
| 7,686,624 B2 * | 3/2010 | Mason | H01R 13/2414 439/91 |
| 7,726,976 B2 | 6/2010 | Mason et al. | |
| 7,726,984 B2 | 6/2010 | Bumb, Jr. et al. | |
| 7,821,283 B1 | 10/2010 | Yamada et al. | |
| 8,926,343 B2 | 1/2015 | Mason et al. | |
| 2020/0150148 A1 | 5/2020 | Chung | |

FOREIGN PATENT DOCUMENTS

| | | |
|---|---|---|
| KR | 101959536 B1 | 3/2019 |
| KR | 102113732 B1 | 5/2020 |

\* cited by examiner

ELECTRICAL INTERCONNECT WITH CONDUCTIVE POLYMER CONTACTS HAVING TIPS WITH DIFFERENT SHAPES AND SIZES

BACKGROUND OF THE INVENTION

The subject matter herein relates generally to electrical interconnects.

The ongoing trend toward smaller, lighter, and higher performance electrical components and higher density electrical circuits has led to the development of socket interconnect technology in the design of electronic packages, such as circuit boards and/or electronic devices. As is well understood in the art, socket interconnects allow for the connection of the package to pads on the surface of the circuit board or device rather than by contacts or pins soldered in plated holes. Socket interconnect technology allows for an increased component density.

Socket interconnects using conductive elastomeric members are known. The interconnect devices have an array of conductive elastomeric columns disposed in a predetermined grid array of rows and columns having a common pitch or spacing. The socket is positioned between adjacent electronic packages so as to make conductive contact between conductive pads on the opposing packages. However, these known interconnect devices are not without disadvantages. For instance, some systems have power requirements. The conductive elastomeric columns are current carrying limits, leading to the use of a large number of the conductive elastomeric columns for power transmission. Additionally, electrical shielding of the conductive elastomeric columns may be insufficient due to the spacing and positioning of the conductive elastomeric columns within the grid array.

A need remains for interconnect systems that can accommodate the high component density and layout of certain electronic packages.

BRIEF DESCRIPTION OF THE INVENTION

In one embodiment, a socket assembly is provided and includes an electrical interconnect having an insulator that has an upper surface and a lower surface. The insulator includes apertures therethrough. The electrical interconnect includes primary contacts received in corresponding apertures and secondary contacts received in corresponding apertures. Each of the primary contacts include a primary conductive polymer column having upper contact tips and lower contact tips for electrically interconnecting first and second electronic packages, respectively. Each of the secondary contacts include a secondary conductive polymer column having upper contact tips and lower contact tips for electrically interconnecting the first and second electronic packages, respectively. The upper contact tips of the primary conductive polymer columns have a first shape and the upper contact tips of the secondary conductive polymer columns have a second shape different from the first shape. The lower contact tips of the primary conductive polymer columns have a third shape and the lower contact tips of the secondary conductive polymer columns have a fourth shape different from the third shape.

In another embodiment, a socket assembly is provided and includes an electrical interconnect having an insulator that has an upper surface and a lower surface. The insulator includes apertures therethrough. The electrical interconnect includes primary contacts received in corresponding apertures and secondary contacts received in corresponding apertures. Each of the primary contacts include a primary conductive polymer column having upper contact tips and lower contact tips for electrically interconnecting first and second electronic packages, respectively. Each of the secondary contacts include a secondary conductive polymer column having upper contact tips and lower contact tips for electrically interconnecting the first and second electronic packages, respectively. The upper contact tips of the primary conductive polymer columns have a first surface area and the upper contact tips of the secondary conductive polymer columns have a second surface area different from the first surface area. The lower contact tips of the primary conductive polymer columns have a third surface area and the lower contact tips of the secondary conductive polymer columns have a fourth surface area different from the third surface area.

In a further embodiment, a socket assembly is provided and includes an electrical interconnect having an insulator that has an upper surface and a lower surface. The insulator includes apertures therethrough. The electrical interconnect includes primary contacts received in corresponding apertures and a secondary contact received in the corresponding aperture. Each of the primary contacts include a primary conductive polymer column having upper contact tips and lower contact tips for electrically interconnecting first and second electronic packages, respectively. The secondary contact includes a secondary conductive polymer column having an upper contact tip and a lower contact tip opposite the upper contact tip for electrically interconnecting the first and second electronic packages, respectively. The secondary conductive polymer column surrounding at least one of the primary conductive polymer column both above the upper surface and below the lower surface to isolate the surrounded primary conductive polymer column from at least one other primary conductive polymer column.

DETAILED DESCRIPTION OF THE INVENTION

Figure 1:
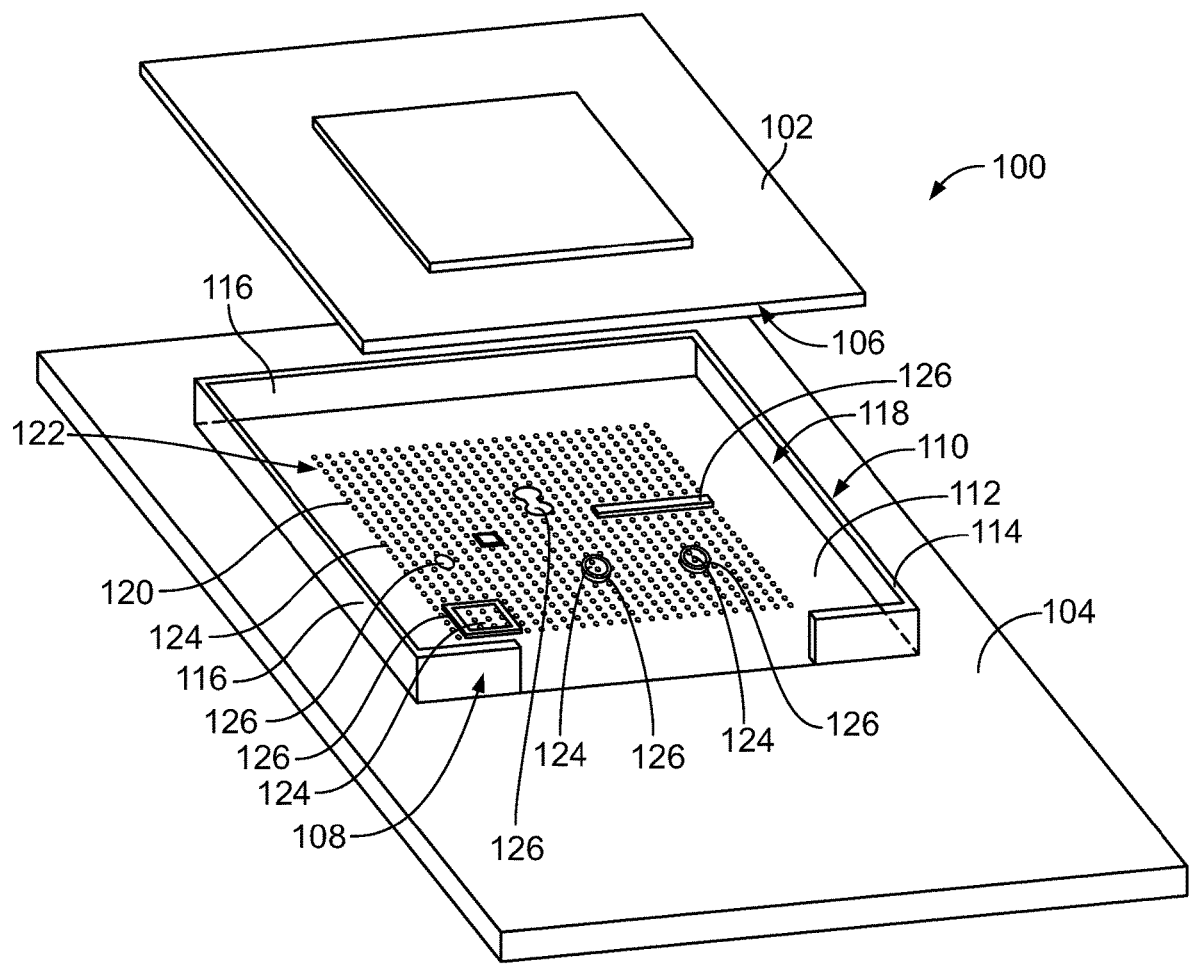
FIG. 1 illustrates an electronic assembly having a socket assembly formed in accordance with an exemplary embodiment.

FIG. 1 illustrates an electronic assembly 100 having a socket assembly 110 formed in accordance with an exemplary embodiment. The socket assembly 110 is used to interconnect two electronic packages 102, 104. The electronic packages 102 and 104 may be either circuit boards or electronic devices, such as a chip or module, such as, but not limited to, a central processing unit (CPU), microprocessor, an application specific integrated circuit (ASIC), or the like. As such, the socket assembly 110 may be one of a board-to-board, board-to-device, or device-to-device type of interconnect system.

In the illustrated embodiment, the socket assembly 110 is a board-to-device interconnect system. The socket assembly 110 is mounted on the second electronic package 104, which is illustrated as, and may be referred to hereinafter as, a circuit board 104. The socket assembly 110 is configured to receive the first electronic package 102, which is illustrated as, and may be referred to hereinafter as, an integrated circuit 102, such as an ASIC. Other types of electronic packages may be used in alternative embodiments.

The socket assembly 110 includes an electrical interconnect 112. The electrical interconnect 112 is used to electrically connect the electronic packages 102, 104. In an exemplary embodiment, the socket assembly 110 includes a housing or socket frame 114 that holds the electrical interconnect 112. The socket frame 114 includes frame members 116 forming a socket opening 118 that receives the first electronic package 102. The frame members 116 locate the first electronic package 102 relative to the electrical interconnect 112. The socket frame 114 is configured to be coupled to the circuit board 104. The socket frame 114 is used to position the socket assembly 110, and the electrical interconnect 112, with respect to the circuit board 104. The socket frame 114 may operate as an anti-overstress load bearing member that stops or limits compression of the electrical interconnect 112 (such as contacts of the electrical interconnect 112) when the electronic assembly 100 is assembled. In various embodiments, the socket frame 114 may surround the perimeter of the electrical interconnect 112. Optionally, the socket frame 114 may have separate components provided at predetermined portions, such as at corners, of the socket assembly 110. The first electronic package 102 is loaded into the socket opening 118. The frame members 116 orient the first electronic package 102 relative to the electrical interconnect 112. When mated with the electrical interconnect 112, the first electronic package 102 is electrically connected to the circuit board 104.

In an exemplary embodiment, the electrical interconnect 112 includes a plurality of compressive polymer contacts 120 arranged in and held in a contact array 122. The contacts 120 within the contact array 122 are arranged in a predetermined pattern. In an exemplary embodiment, the electrical interconnect 112 includes primary contacts 124 and secondary contacts 126, which are different from each other. For example, the primary and secondary contacts 124, 126 may have different sizes and/or shapes. For example, the upper tips of the primary contacts 124 may have first shapes and the upper tips of the secondary contacts 126 may have second shapes different from the first shapes. The lower tips of the primary contacts 124 may have third shapes and the lower tips of the secondary contacts 126 may have fourth shapes different from the third shapes. Optionally, the first and third shapes may be the same and the second and fourth shapes may be the same. The primary contacts 124 may have different heights than the secondary contacts 126. In various embodiments, various types of primary contacts 124 may be provided (for example, different size/shape) and/or various types of secondary contacts 126 may be provided (for example, different size/shape). The primary and secondary contacts 124, 126 may be used for different transmissions. For example, the secondary contacts 126 may be used for power transmission, while the primary contacts 124 may be used for signal transmission. In various embodiments, the secondary contacts 126 may have higher current carrying capacity compared to the primary contacts 124. In various embodiments, the secondary contacts 126 may be used to provide electrical shielding for the primary contacts 124. For example, the secondary contacts 126 may be used as shield fences to surround or isolate various primary contacts 124 from each other. The locations of the primary and secondary contacts 124, 126 is based on the particular mating interfaces of the first and second electronic packages 102, 104. For example, the locations of high speed signal pads, low speed signal pads, ground pads, power pads, and the like. The sizes and shapes of the primary and secondary contacts 124, 126 may correspond with the size and shapes of the contact pads of the first and second electronic packages 102, 104.

The first electronic package 102 has a mating interface 106 having a plurality of the contact pads (not shown in FIG. 1) that engage the contacts 120. The circuit board 104 also has a mating interface 108 having a plurality of the contact pads (not shown in FIG. 1) that engage the contacts 120. The mating interfaces 106, 108 of the first and second electronic packages 102, 104 may be a land grid array (LGA) interface. In alternative embodiments, the mating interfaces 106, 108 of the first and second electronic packages 102, 104 may be ball grid array (BGA) interfaces. The mating interfaces 106, 108 may have substantially similar pattern as the contacts 120 for mating thereto.

Figure 2:
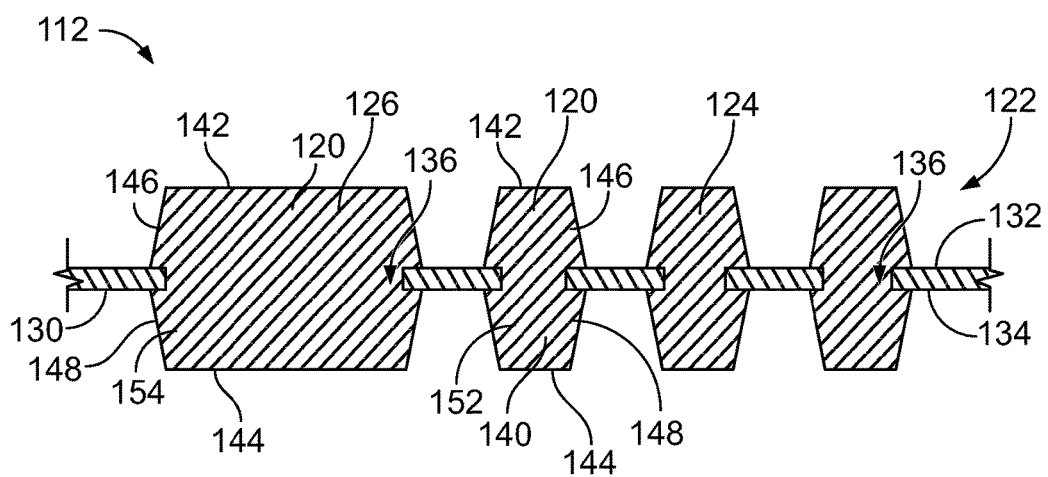
FIG. 2 is a cross-sectional view of a portion of the electrical interconnect in accordance with an exemplary embodiment.

FIG. 2 is a cross-sectional view of a portion of the electrical interconnect 112 in accordance with an exemplary embodiment. The electrical interconnect 112 includes the contact array 122 of contacts 120. The contact array 122 includes an insulative substrate 130, which is also referred to hereinafter as an insulator 130. In an exemplary embodiment, the insulator 130 is a polyimide sheet, but other types of known insulative substrates may be used. The insulator 130 includes an upper surface 132 and a lower surface 134 opposite the upper surface 132. The insulator 130 includes a plurality of apertures 136 therethrough arranged in a predetermined pattern. The compressive polymer contacts 120 are retained within the apertures 136 of the insulator 130. Optionally, the contacts 120 may be molded in place to the insulator 130. In various embodiments, the apertures 136 may be sized and/or shaped differently to receive the primary contacts 124 and the secondary contacts 126, such as when the primary and secondary contacts 124, 126 have different sizes and/or shapes.

In an exemplary embodiment, the compressive polymer contacts 120 have a polymer base or column 140 and metal particles within the polymer column 140. One example of a polymer compound that may be used to fabricate the column 140 is a silicone material, such as silicone rubber. Any metal particles, such as silver particles, may be dispersed throughout the polymer column 140 to form the contacts 120. The conductive particles of the contacts 120 function as a conductor to provide an electrically conductive path. The contacts 120 thus define conductive polymer columns that extend between opposed upper and lower mating ends or contact tips 142, 144, which are arranged for mating engagement with the contact pads of the first and second electronic packages 102, 104 (shown in FIG. 1). In various embodiments, the polymer-based compressible contacts 120 may be metallized-particle interconnect (MPI) columns.

The columns 140 have upper portions 146 above the upper surface 132 and extending to the upper contact tip 142 and lower portions 148 below the lower surface 134 and extending to the lower contact tip 144. Optionally, the column 140 may have angled surfaces leading from the insulator 130 to the contact tips 142, 144. For example, the column 140 may be a truncated cone have a generally frusto-conical shape at each end of the column 140. The column 140 is wider at the insulator 130 than at the contact tips 142, 144. The columns 140 of the primary contacts 124 are primary conductive polymer columns 152 and the columns of the secondary contacts 126 are secondary conductive polymer columns 154. In various embodiments, the primary conductive polymer columns 152 have different sizes (for example, lengths and/or widths and/or heights) than the secondary conductive polymer columns 154. In various embodiments, the primary conductive polymer columns 152 have different shapes than the secondary conductive polymer columns 154. The primary conductive polymer columns 152 may have different heights than the secondary conductive polymer columns 154. The apertures 136 may be sized and/or shaped differently to receive the primary conductive polymer columns 152 and the secondary conductive polymer columns 154, such as when the primary and secondary conductive polymer columns 152, 154 have different sizes and/or shapes.

Figure 3:
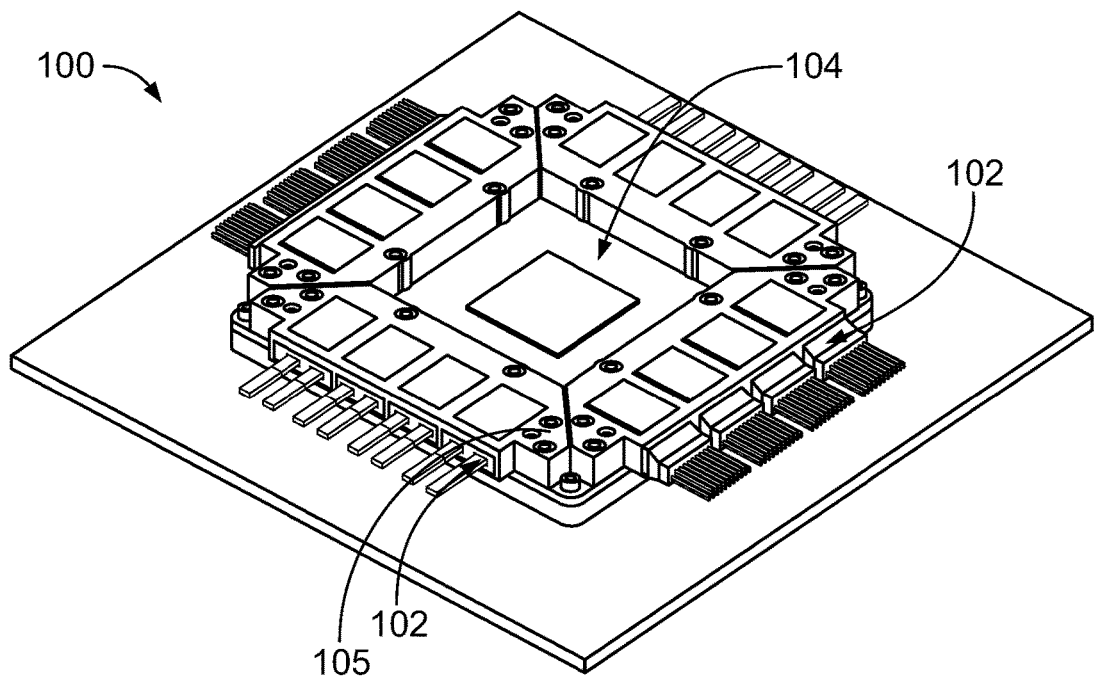
FIG. 3 illustrates the electronic assembly in accordance with an exemplary embodiment having a plurality of socket assemblies in accordance with an exemplary embodiment.
Figure 4:
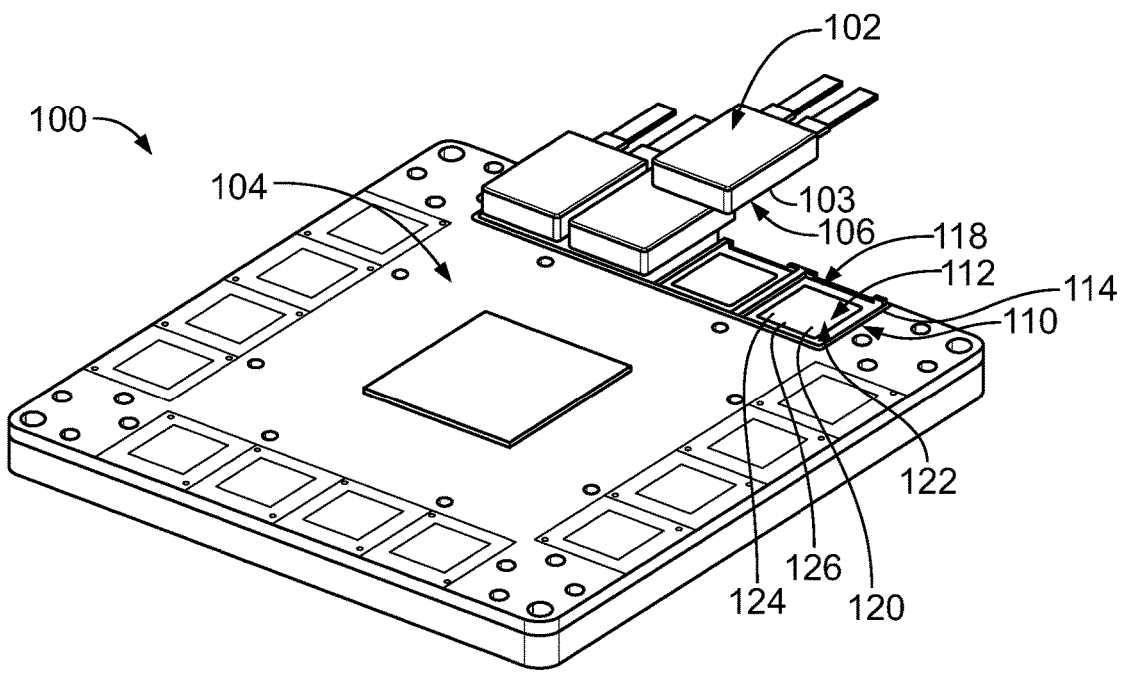
FIG. 4 is an exploded view of a portion of the electronic assembly shown in FIG. 3 in accordance with an exemplary embodiment.

FIG. 3 illustrates the electronic assembly 100 in accordance with an exemplary embodiment having a plurality of socket assemblies 110 (shown in FIG. 4) formed in accordance with an exemplary embodiment. FIG. 4 is an exploded view of a portion of the electronic assembly 100 shown in FIG. 3 in accordance with an exemplary embodiment. The socket assemblies 110 are used to interconnect the electronic packages 102, 104. In the illustrated embodiment, the socket assemblies 110 form a device-to-device interconnect system. In the illustrated embodiment, the second electronic package 104 is an integrated circuit, such as an ASIC. The second electronic package 104 may be mounted to and electrically connected to a circuit board, such as a host circuit board. However, the socket assemblies 110 are mounted to a substrate or board of the ASIC, such as at the top surface, to allow connection of the first electronic packages 102 directly to the board of the ASIC.

In the illustrated embodiment, a plurality of first electronic packages 102 are coupled to corresponding socket assemblies 110 to electrically connect the first electronic packages 102 to the second electronic package 104. The first electronic packages 102 are electronic devices, such as modules configured to be mounted into the socket assemblies 110. For example, the first electronic packages 102 may be high speed cable connectors and/or fiber optic modules. The first electronic packages 102 may include circuit boards 103 (FIG. 4) having pads at the mating interface 106 to interface with the socket assemblies 110. Module holders 105 (FIG. 3) may be coupled to the first electronic packages 102 to position and press the first electronic packages 102 into contact with the socket assemblies 110. A heat sink (not shown) may be coupled to the tops of the first electronic packages 102 to dissipate heat from the first electronic packages 102.

Each socket assembly 110 includes the electrical interconnect 112 and the socket frame 114, which holds the electrical interconnect 112. The first electronic package 102 is received in the socket opening 118 of the socket frame 114 to locate the first electronic package 102 relative to the electrical interconnect 112. The socket frame 114 is configured to be coupled to the board of the second electronic package 104 to position the socket assembly 110 with respect to the board of the second electronic package 104.

The compressive polymer contacts 120 within the contact array 122 are arranged in a predetermined pattern of primary contacts 124 and secondary contacts 126, which are different from each other. For example, the primary and secondary contacts 124, 126 may have different sizes and/or shapes. In various embodiments, the secondary contacts 126 may have higher current carrying capacity compared to the primary contacts 124. In various embodiments, the secondary contacts 126 may be used to provide electrical shielding for the primary contacts 124.

Figure 5:
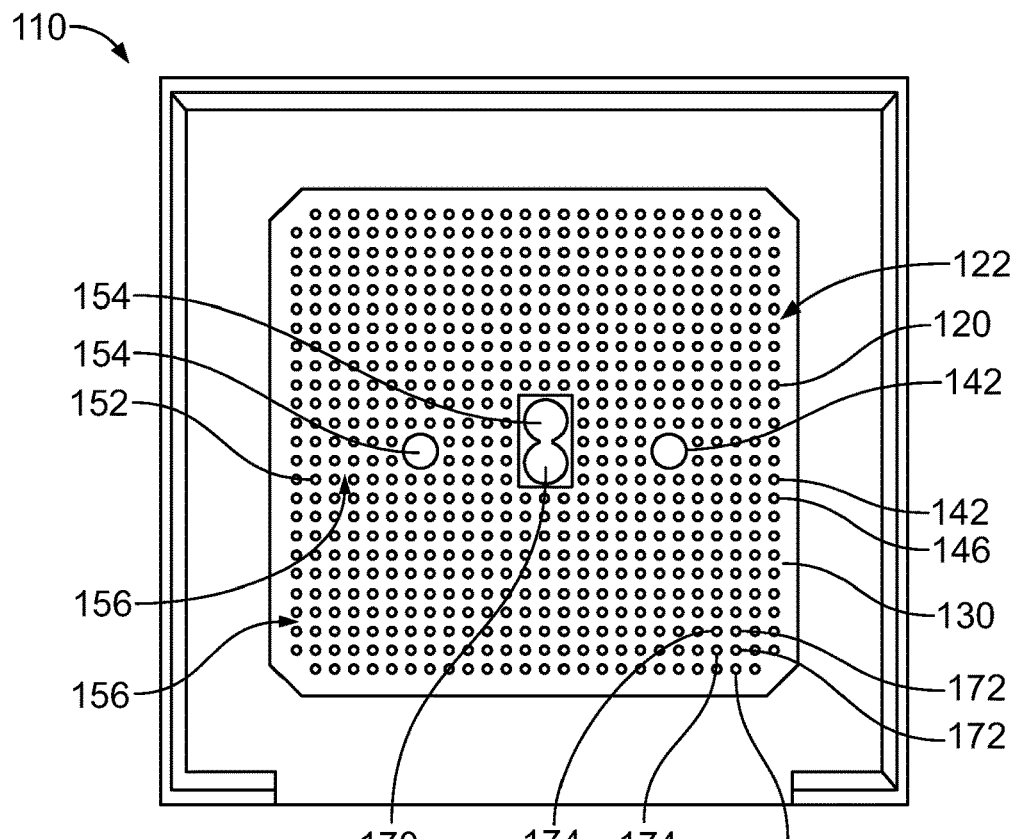
FIG. 5 is a top view of the socket assembly in accordance with an exemplary embodiment.
Figure 6:
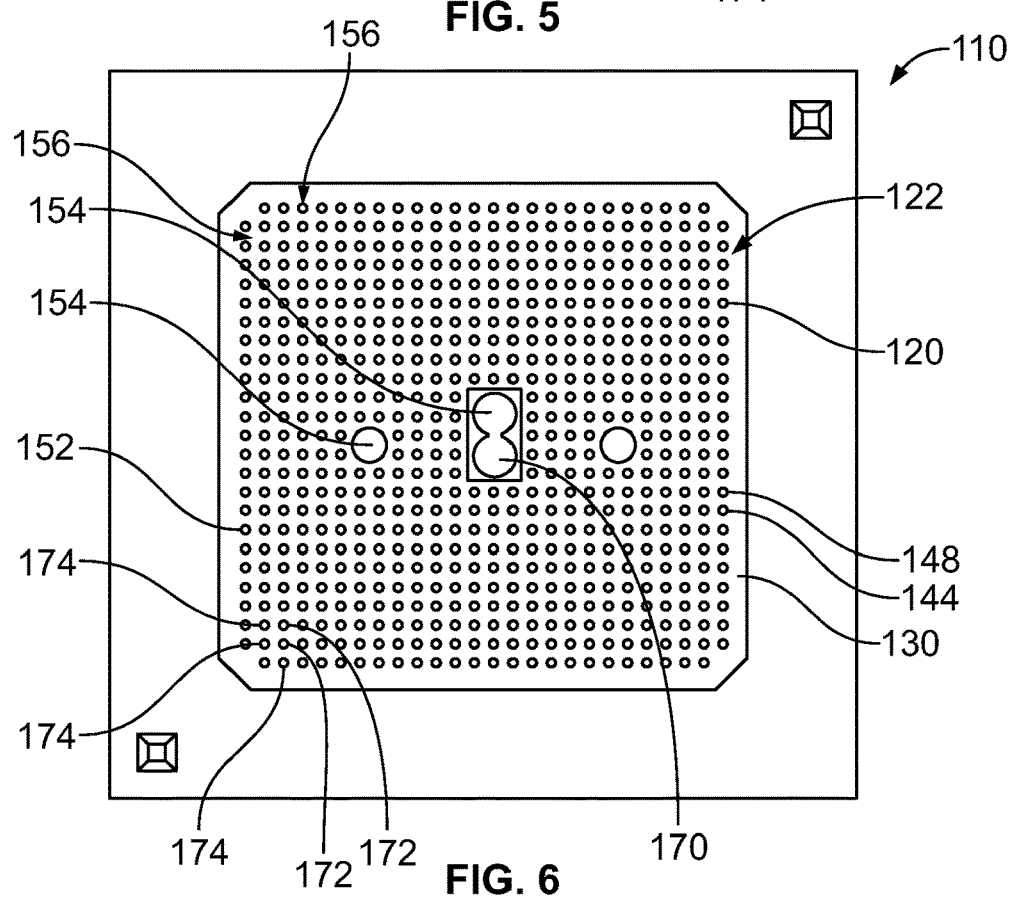
FIG. 6 is a bottom view of the socket assembly shown in FIG. 5 in accordance with an exemplary embodiment.

FIG. 5 is a top view of the socket assembly 110 in accordance with an exemplary embodiment. FIG. 6 is a bottom view of the socket assembly 110 shown in FIG. 5 in accordance with an exemplary embodiment. The socket assembly 110 includes one or more enlarged secondary conductive polymer columns 154. In the illustrated embodiment, the secondary conductive polymer columns 154 have a similar shape as the primary conductive polymer columns 152; however, the secondary conductive polymer columns 154 have a large volume and larger surface area than the primary conductive polymer columns 152. For example, the primary and secondary conductive polymer columns 152, 154 are frusto-conical shaped having circular cross-sections. The sides of the upper and lower portions 146, 148 are tapered inward such that the upper and lower contact tips 142, 144 have smaller diameters than the bases of the upper and lower portions 146, 148 at the insulator 130. The primary conductive polymer columns 152 may have different heights than the secondary conductive polymer columns 154. The primary conductive polymer columns 152 may have different diameters than the secondary conductive polymer columns 154. Optionally, primary conductive polymer columns 152 may be shorter and wider compared to the secondary conductive polymer columns 154, which are taller and narrower. Larger columns are typically shorter than smaller columns, because the larger columns do not compress as much with a given force as the smaller columns. As such, the different sized columns may end up at the same height (for example, coplanar) when compressed.

In an exemplary embodiment, various secondary conductive polymer columns 154 may be arranged adjacent each other to form combined columns that are molded with each other to form a single columnar structure. Other secondary conductive polymer columns 154 are separated from the other columns as separate columns. Optionally, the secondary conductive polymer columns 154 may be grouped together, such as at the center of the contact array 122 or around the outer perimeter of the contact array 122. In various embodiments, the secondary conductive polymer columns 154 define power columns 170 configured to convey power between the first and second electronic packages 102, 104. The secondary conductive polymer columns 154 are larger than the primary conductive polymer columns 152 (for example, having a larger volume and larger mating interfaces at the upper and lower contact tips 142, 144) to increase current carrying capacity and reduce resistance at the mating interfaces. In various embodiments, the secondary conductive polymer columns 154 are more than twice as large as the primary conductive polymer columns 152. The contacts 120 are arranged in rows and columns with gaps 156 between the rows and columns. The secondary conductive polymer columns 154 may fill multiple rows and/or multiple columns compared to the primary conductive polymer columns 152. The secondary conductive polymer columns 154 may at least partially fill gaps 156, such as to increase the volume of the secondary conductive polymer columns 154 compared to the primary conductive polymer columns 152.

The primary conductive polymer columns 152 define signal columns 172 and ground columns 174. The ground columns 174 provide electrical shielding between the signal columns 172. The ground columns 174 may provide electrical shielding between the signal columns 172 and the power columns 170. Optionally, the signal columns 172 may be arranged in pairs, which are surrounded (for example, north, south, east, west) by ground columns 174. Other arrangements are possible for the primary and secondary conductive polymer columns 152, 154.

Figure 7:
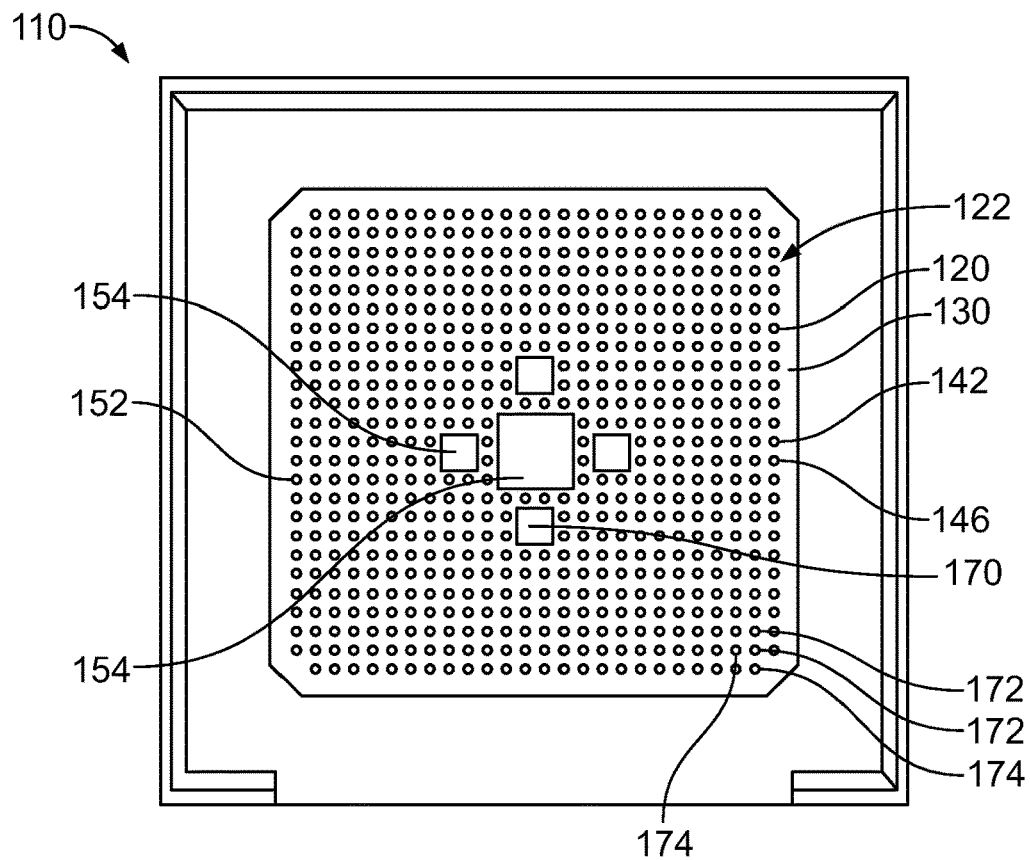
FIG. 7 is a top view of the socket assembly in accordance with an exemplary embodiment.
Figure 8:
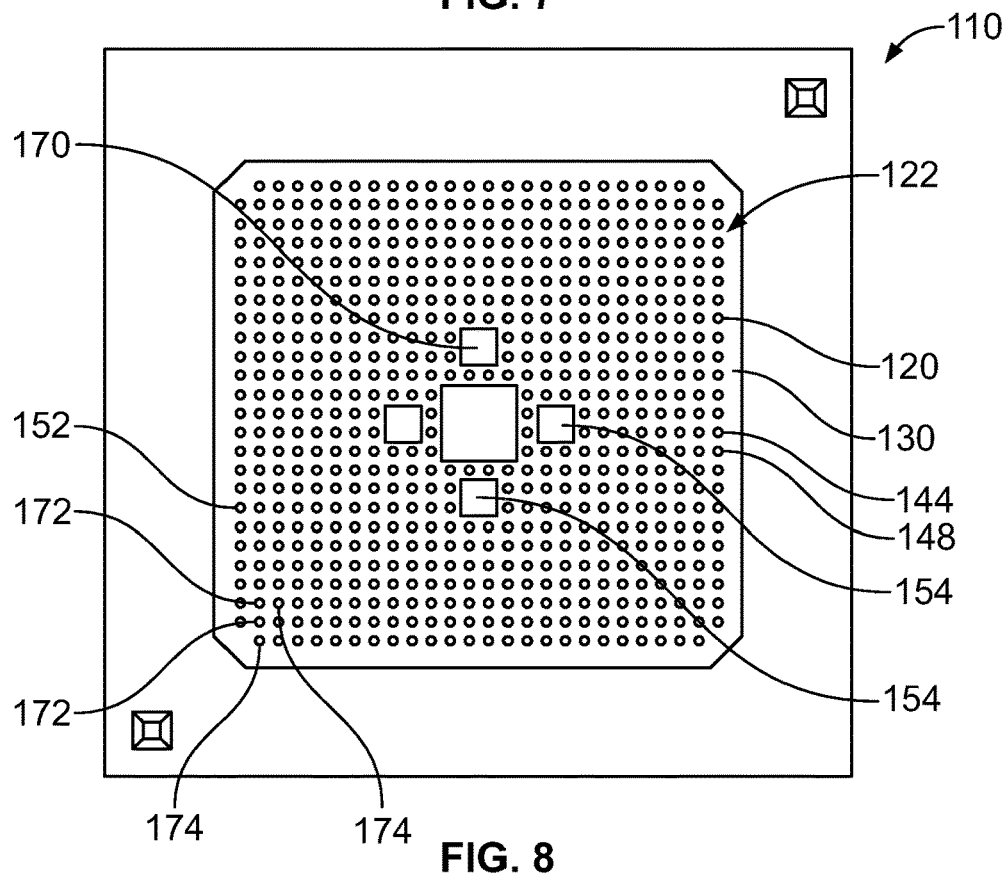
FIG. 8 is a bottom view of the socket assembly shown in FIG. 7 in accordance with an exemplary embodiment.

FIG. 7 is a top view of the socket assembly 110 in accordance with an exemplary embodiment. FIG. 8 is a bottom view of the socket assembly 110 shown in FIG. 7 in accordance with an exemplary embodiment. The socket assembly 110 includes one or more enlarged secondary conductive polymer columns 154. In the illustrated embodiment, the secondary conductive polymer columns 154 have different shapes as the primary conductive polymer columns 152. The secondary conductive polymer columns 154 may have different sizes as the primary conductive polymer columns 152 (for example, larger volume and larger surface area). The primary conductive polymer columns 152 may have different heights than the secondary conductive polymer columns 154.

In the illustrated embodiment, the upper and lower portions 146, 148 of the secondary conductive polymer columns 154 are truncated pyramids having rectangular cross-sections. The sides of the upper and lower portions 146, 148 are tapered inward such that the upper and lower contact tips 142, 144 have smaller areas than the bases of the upper and lower portions 146, 148 at the insulator 130. Optionally, the secondary conductive polymer columns 154 may be grouped together, such as at the center of the contact array 122 or around the outer perimeter of the contact array 122. In various embodiments, the secondary conductive polymer columns 154 define power columns 170 configured to convey power between the first and second electronic packages 102, 104. The secondary conductive polymer columns 154 are larger than the primary conductive polymer columns 152 to increases current carrying capacity and reduce resistance at the mating interfaces. In alternative embodiments, the secondary conductive polymer columns 154 may define the signal columns 172 or the ground columns 174. For example, the secondary conductive polymer columns 154 may provide electrical shielding for the primary conductive polymer columns 152. Other arrangements are possible for the primary and secondary conductive polymer columns 152, 154.

Figure 9:
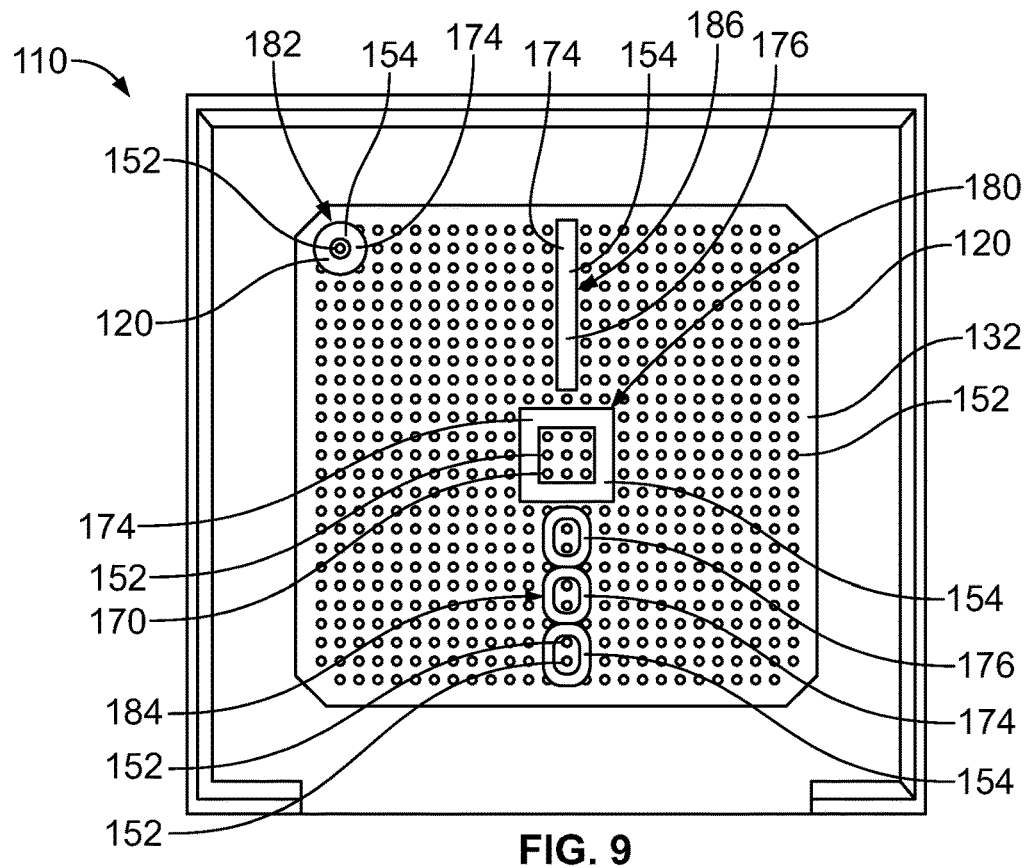
FIG. 9 is a top view of the socket assembly in accordance with an exemplary embodiment.
Figure 10:
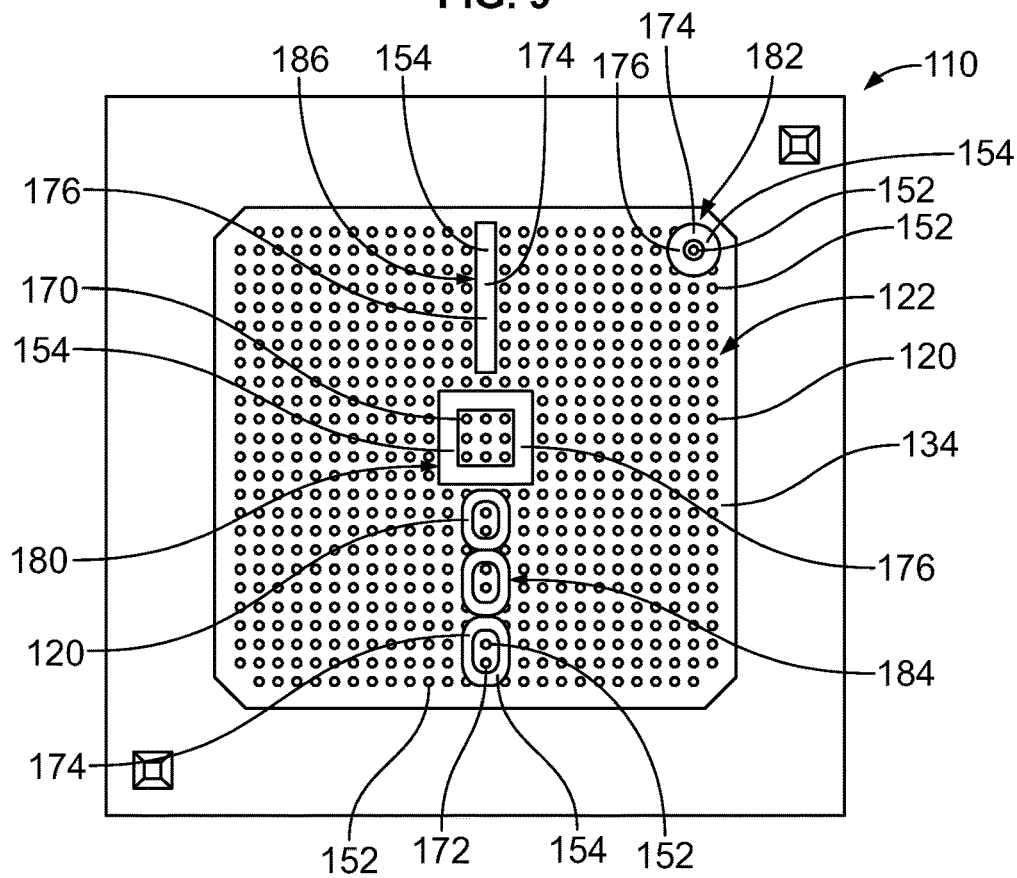
FIG. 10 is a bottom view of the socket assembly shown in FIG. 9 in accordance with an exemplary embodiment.

FIG. 9 is a top view of the socket assembly 110 in accordance with an exemplary embodiment. FIG. 10 is a bottom view of the socket assembly 110 shown in FIG. 9 in accordance with an exemplary embodiment. In the illustrated embodiment, the secondary conductive polymer columns 154 define ground columns 174. The secondary conductive polymer columns 154 provide shielding for corresponding primary conductive polymer columns 152.

In an exemplary embodiment, the secondary conductive polymer columns 154 form shielding fences 176 for the polymer columns. The shielding fences 176 electrically isolate the primary conductive polymer columns 152 from other primary conductive polymer columns 152. The shapes of the shielding fences 176 are designed to provide enhanced shielding compared to conventional socket assemblies that simply have an array of columns, without the differently shaped secondary conductive polymer columns 154. The primary conductive polymer columns 152 may have different heights than the secondary conductive polymer columns 154. The primary conductive polymer columns 152 may have different heights than the secondary conductive polymer columns 154. Optionally, the secondary conductive polymer columns 154 may surround at least one of the primary conductive polymer column 152 both above the upper surface 132 and below the lower surface 134 to isolate the surrounded primary conductive polymer column(s) 152 from other primary conductive polymer columns 152. When manufactured, the secondary conductive polymer columns 154 may include slots or openings through the surrounding wall formed by the forming tools or dies during manufacture.

At a first area 180, the contacts 120 are arranged with multiple primary conductive polymer columns 152 in a sub-array surrounded by a single secondary conductive polymer column 154. For example, the secondary conductive polymer column 154 may be box-shaped to surround the primary conductive polymer columns 152. The secondary conductive polymer column 154 includes a series of walls (for example, four orthogonal walls) forming the shielding fence 176. In various embodiments, the interior primary conductive polymer columns 152 are power columns 170 and the secondary conductive polymer column 154 provides the shielding fence 176 around the array of power columns 170.

At a second area 182, the contacts 120 form a coaxial arrangement with a single primary conductive polymer column 152 surrounded by a single secondary conductive polymer column 154. For example, the secondary conductive polymer column 154 may be ring shaped to surround the primary conductive polymer column 152.

At a third area 184, the contacts 120 form a twin-axial arrangement with a pair of primary conductive polymer columns 152 surrounded by a single secondary conductive polymer column 154. For example, the secondary conductive polymer column 154 may be oval or racetrack-shaped having a pocket to surround the primary conductive polymer column 152. Optionally, at the third area 184, multiple secondary conductive polymer columns 154 may be stacked and co-molded as a single structure forming multiple pockets around corresponding primary conductive polymer columns 152.

At a fourth area 186, the secondary conductive polymer column 154 is elongated forming a linear wall. The secondary conductive polymer column 154 spans multiple columns (or rows) to isolate primary conductive polymer columns 152 on one side from primary conductive polymer columns 152 on the other side.

In various embodiments, the secondary conductive polymer columns 154 may form an outer boundary along the exterior perimeter of the array of primary conductive columns 152, such as along one or more sides of the array of primary conductive columns 152. The boundary secondary conductive polymer columns 154 may be used as compression stops for the primary conductive columns 152. For example, the boundary secondary conductive polymer columns 154 may be shorter than the primary conductive columns 152 and thicker or made from a different, stiffer material to limit compression when mated with the electronic packages.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket assembly comprising:
an electrical interconnect having an insulator having an upper surface and a lower surface, the insulator including apertures therethrough, the electrical interconnect including primary contacts received in corresponding apertures and secondary contacts received in corresponding apertures, the primary contacts including primary conductive polymer columns having upper contact tips extending above the upper surface to distal ends and lower contact tips extending below the lower surface to distal ends, the upper and lower contact tips for electrically interconnecting first and second electronic packages, respectively, the secondary contacts including secondary conductive polymer columns having upper contact tips extending above the upper surface to distal ends and lower contact tips extending below the lower surface to distal ends, the upper and lower contact tips for electrically interconnecting the first and second electronic packages, respectively;
wherein the upper contact tips above the upper surface of the primary conductive polymer columns have a first shape and the upper contact tips above the upper surface of the secondary conductive polymer columns have a second shape different from the first shape to provide shielding in spaces between the upper contact tips of the primary conductive polymer columns; and
wherein the lower contact tips below the lower surface of the primary conductive polymer columns have a third shape and the lower contact tips below the lower surface of the secondary conductive polymer columns have a fourth shape different from the third shape to provide shielding in spaces between the lower contact tips of the primary conductive polymer columns.

2. The socket assembly of claim 1, wherein the upper contact tips of the primary conductive polymer columns have a circular shape and the upper contact tips of the secondary conductive polymer columns have a noncircular shape, and wherein the lower contact tips of the primary conductive polymer columns have a circular shape and the lower contact tips of the secondary conductive polymer columns have a noncircular shape.

3. The socket assembly of claim 2, wherein the upper and lower contact tips of the secondary conductive polymer columns have a rectangular shape.

4. The socket assembly of claim 2, wherein the upper and lower contact tips of the secondary conductive polymer columns are generally ring shaped.

5. The socket assembly of claim 1, wherein the upper contact tips of the primary conductive polymer columns are circular having a first diameter and the upper contact tips of the secondary conductive polymer columns are circular having a second diameter different than the first diameter, and wherein the lower contact tips of the primary conductive polymer columns are circular having a third diameter and the lower contact tips of the secondary conductive polymer columns are circular having fourth diameter different than the third diameter.

6. The socket assembly of claim 1, wherein the primary conductive polymer columns each include an upper portion between the upper surface and the upper contact tips and a lower portion between the lower surface and the lower contact tips, the upper portions being frusto-conical shaped, the lower portions being frusto-conical shaped.

7. The socket assembly of claim 6, wherein the secondary conductive polymer columns each include an upper portion between the upper surface and the upper contact tips and a lower portion between the lower surface and the lower contact tips, the upper portions being frusto-conical shaped, the lower portions being frusto-conical shaped.

8. The socket assembly of claim 6, wherein the secondary conductive polymer columns each include an upper portion between the upper surface and the upper contact tips and a lower portion between the lower surface and the lower contact tips, the upper portions being parallel-piped shaped, the lower portions being trapezoidal shaped.

9. The socket assembly of claim 1, wherein the upper contact tips of the primary and secondary conductive polymer columns are generally coplanar, and wherein the lower contact tips of the primary and secondary conductive polymer columns are generally non-coplanar.

10. The socket assembly of claim 1, wherein the upper contact tips of the primary conductive polymer columns have a first surface area and the upper contact tips of the secondary conductive polymer columns have a second surface area different from the first surface area, and wherein the lower contact tips of the primary conductive polymer columns have a third surface area and the lower contact tips of the secondary conductive polymer columns have a fourth surface area different from the third surface area.

11. The socket assembly of claim 10, wherein the second surface area is at least twice the first surface area and the fourth surface area is at least twice the third surface area.

12. The socket assembly of claim 1, wherein at least one of the secondary conductive polymer columns surround at least one of the primary conductive polymer columns both above the upper surface and below the lower surface to form a shield fence to isolate the surrounded at least one primary conductive polymer column from at least one other primary conductive polymer column.

13. The socket assembly of claim 1, further comprising a socket frame coupled to the insulator, the socket frame having a socket opening configured to receive and orient the first electronic package relative to the electrical interconnect.

14. The socket assembly of claim 1, wherein the secondary conductive polymer columns are electrically commoned to provide shielding for the primary conductive polymer columns.

15. The socket assembly of claim 1, wherein the secondary conductive polymer columns have a larger volume than the primary conductive polymer columns, the secondary conductive polymer columns having a higher current carrying capacity than the primary conductive polymer columns.

16. A socket assembly comprising:
an electrical interconnect having an insulator having an upper surface and a lower surface, the insulator including apertures therethrough, the electrical interconnect including primary contacts received in corresponding apertures and secondary contacts received in corresponding apertures, the primary contacts including primary conductive polymer columns having upper contact tips extending above the upper surface to distal ends and lower contact tips extending below the lower surface to distal ends, the upper and lower contact tips for electrically interconnecting first and second electronic packages, respectively, the secondary contacts including secondary conductive polymer columns having upper contact tips extending above the upper surface to distal ends and lower contact tips extending below the lower surface to distal ends, the upper and lower contact tips for electrically interconnecting the first and second electronic packages, respectively;
wherein the upper contact tips above the upper surface of the primary conductive polymer columns have a first surface area and the upper contact tips above the upper surface of the secondary conductive polymer columns have a second surface area different from the first surface area to provide shielding in spaces between the upper contact tips of the primary conductive polymer columns; and
wherein the lower contact tips below the lower surface of the primary conductive polymer columns have a third surface area and the lower contact tips below the lower surface of the secondary conductive polymer columns have a fourth surface area different from the third surface area to provide shielding in spaces between the lower contact tips of the primary conductive polymer columns.

17. The socket assembly of claim 16, wherein the second surface area is at least twice the first surface area and the fourth surface area is at least twice the third surface area.

18. The socket assembly of claim 16, wherein the primary conductive polymer columns each include an upper portion between the upper surface and the upper contact tips and a lower portion between the lower surface and the lower contact tips, the upper portions being frusto-conical shaped, the lower portions being frusto-conical shaped, the secondary conductive polymer columns each include an upper portion between the upper surface and the upper contact tips and a lower portion between the lower surface and the lower contact tips, the upper portions being non-frusto-conical shaped, the lower portions being non-frusto-conical shaped.

19. A socket assembly comprising:
an electrical interconnect having an insulator having an upper surface and a lower surface, the insulator including apertures therethrough, the electrical interconnect including primary contacts received in corresponding apertures and a secondary contact received in the corresponding aperture, the primary contacts including primary conductive polymer columns having upper contact tips extending above the upper surface to distal ends and lower contact tips extending below the lower surface to distal ends for electrically interconnecting first and second electronic packages, respectively, the secondary contact including a secondary conductive polymer column having an upper contact tip extending above the upper surface to distal ends and a lower contact tip extending below the lower surface to distal ends opposite the upper contact tip, the upper and lower contact tips for electrically interconnecting the first and second electronic packages, respectively, wherein at least one of the secondary conductive polymer column forming a shield fence surrounding at least one of the primary conductive polymer columns both above the upper surface and below the lower surface to isolate the surrounded primary conductive polymer column from at least one other primary conductive polymer column.

20. The socket assembly of claim 19, wherein the primary conductive polymer columns are arranged in pairs configured to convey high-speed differential signals, the shield fence defined by the at least one secondary conductive polymer column surrounding the corresponding pair of primary conductive polymer columns.

* * * * *